United States Patent
Yasui et al.

(10) Patent No.: US 7,339,827 B2
(45) Date of Patent: Mar. 4, 2008

(54) NON-VOLATILE SEMICONDUCTOR MEMORY DEVICE AND WRITING METHOD THEREOF

(75) Inventors: Kan Yasui, Kodaira (JP); Digh Hisamoto, Kokubunji (JP); Toshihiro Tanaka, Akiruno (JP); Takashi Yamaki, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 148 days.

(21) Appl. No.: 11/147,243

(22) Filed: Jun. 8, 2005

(65) Prior Publication Data
US 2005/0285181 A1 Dec. 29, 2005

(30) Foreign Application Priority Data
Jun. 10, 2004 (JP) .............................. 2004-172078

(51) Int. Cl.
*G11C 16/06* (2006.01)
*G11C 16/32* (2006.01)
*G11C 5/06* (2006.01)
*G11C 16/08* (2006.01)
*G11C 16/24* (2006.01)

(52) U.S. Cl. .......................... 365/185.18; 365/185.05; 365/185.23; 365/233; 365/194; 365/185.14

(58) Field of Classification Search ........... 365/185.18, 365/185.23, 194, 191, 233, 185.02, 185.05, 365/185.25, 203, 204, 185.14
See application file for complete search history.

(56) References Cited

U.S. PATENT DOCUMENTS

| | | | | |
|---|---|---|---|---|
| 4,344,154 A | * | 8/1982 | Klaas et al. ................ | 365/194 |
| 5,187,683 A | * | 2/1993 | Gill et al. .............. | 365/185.06 |
| 5,969,383 A | * | 10/1999 | Chang et al. ............... | 257/316 |
| 5,991,204 A | * | 11/1999 | Chang ................... | 365/185.29 |
| 6,111,789 A | * | 8/2000 | Choi et al. ............. | 365/185.22 |
| 6,255,166 B1 | * | 7/2001 | Ogura et al. ................ | 438/257 |

(Continued)

FOREIGN PATENT DOCUMENTS

JP  5-048113  2/1993

(Continued)

OTHER PUBLICATIONS

A JPO computer translation of JP 07030076 A.*

(Continued)

*Primary Examiner*—J. H. Hur
(74) *Attorney, Agent, or Firm*—Miles & Stockbridge P.C.

(57) ABSTRACT

In connection with rise and fall of a word line bias, the present invention adopts a procedure such that a diffusion region voltage Vs on a memory transistor side is changed, and after the voltage Vs passes a certain intermediate value Vsx, a gate voltage Vmg of the memory transistor is changed. Alternatively, there is adopted a procedure such that the gate voltage Vmg of the memory transistor is changed, and after the voltage Vmg passes a certain intermediate value Vmgx, the diffusion layer voltage Vs on the memory transistor side is changed. The values of Vsx and Vmgx are determined from the magnitude of the electric field in a gate insulating film not causing FN tunneling electron injection that causes a change in threshold voltage and the magnitude of a potential barrier against holes not causing BTBT hot hole injection.

18 Claims, 14 Drawing Sheets

U.S. PATENT DOCUMENTS

| | | | |
|---|---|---|---|
| 6,807,105 B2* | 10/2004 | Ogura et al. | 365/185.28 |
| 7,132,718 B2* | 11/2006 | Hisamoto et al. | 257/407 |
| 2001/0050862 A1* | 12/2001 | Nakamura | 365/185.11 |
| 2001/0054737 A1* | 12/2001 | Nakamura et al. | 257/315 |
| 2004/0119107 A1 | 6/2004 | Hisamoto et al. | 257/314 |
| 2005/0226055 A1* | 10/2005 | Guterman | 365/185.28 |

FOREIGN PATENT DOCUMENTS

| | | |
|---|---|---|
| JP | 5-121700 | 5/1993 |
| JP | 07030076 A * | 1/1995 |
| JP | 2004-186452 | 7/2004 |

OTHER PUBLICATIONS

Kianian et al., "A Novel 3 Volts-Only, Small Sector Erase, High Density Flash E$^2$Prom", *1994 Symposium on VLSI Technology Digest of Technical Papers*, 1994, pp. 71-72.

Chen et al., "A Novel Flash Memory Device with SPlit Gate Source Side Injection and ONO Charge Storage Stack (SPIN)", *1997 Symposium on VLSI Technology Digest of Technical Papers*, 1997, pp. 63-64.

* cited by examiner

FIG. 3

|  | Vmg | Vs | Vcg | Vd | Vsub |
|---|---|---|---|---|---|
| READ [V] | 1.5 | 0 | 1.5 | 1 | 0 |
| WRITE [V] | 12 | .5 | 1.5 | 1 | 0 |
| ERASE [V] | -5 | 7 | 0 | OPEN | 0 |

NON-VOLATILE SEMICONDUCTOR MEMORY DEVICE AND WRITING METHOD THEREOF

CLAIM OF PRIORITY

The present application claims priority from Japanese application JP 2004-172078 filed on Jun. 10, 2004, the content of which is hereby incorporated by reference into this application.

BACKGROUND OF THE INVENTION

1. Field of the Invention

The present invention relates to a non-volatile semiconductor memory-device and a writing method thereof. In particular, the present invention is concerned with a non-volatile semiconductor memory device to be mounted on the same substrate as that of a semiconductor device having a logical operation function which is typified by a microcomputer.

2. Description of the Related Art

By mounting a non-volatile semiconductor memory cell on the same silicon substrate as that of a semiconductor device for logical operation it becomes possible to implement a semiconductor device of a high-level function. Such high-level function semiconductor devices are used as built-in type microcomputers widely in industrial machines, home electric appliances and devices mounted on automobiles. Generally, in the non-volatile memory are stored programs which the microcomputer requires, and the programs are read out and used as necessary. As an example of a cell structure of the non-volatile memory suitable for the mixed mounting together with the semiconductor device for logical operation there is mentioned a split gate type memory cell comprising a MOS transistor for selection and a MOS transistor for storage. This structure is mainly adopted in the mixed mounting because a small area of a memory controlling peripheral circuit suffices. As examples of related technical literatures are mentioned Japanese Patent Laid Open Nos. Hei 5(1993)-48113 and Hei 5(1993)-121700, IEEE, VLSI Technology Symposium, 1994 Proceedings, pp. 71 to 72, and IEEE, VLSI Technology Symposium, 1997 Proceedings, pp. 63 to 64, (Patent Document 1, Patent Document 2, Non-Patent Document 1, Non-Patent Document 2, respectively).

As charge storing methods in MOS type transistors for storage there are known a floating gate method (disclosed in Patent Literature 2 and Non-Patent Literature 1) wherein an electric charge is stored in an electrically isolated and electrically conductive polycrystalline silicon and a MONOS method (disclosed in Patent Literature 1 and Non-Patent Literature 2) wherein an electric charge is stored in an insulating film having a charge storing property such as silicon nitride film.

The floating gate method is in wide use, for example, portable telephone-oriented flash memories for the storage of programs and large-capacity flash memories for the storage of data and is superior in charge retention characteristic. However, according to scaling, it becomes difficult to ensure a capacitive coupling ratio necessary for controlling the potential of a floating gate and the structure is becoming more and more complicated. To suppress the leakage of held charge it is considered necessary that the thickness of oxide film which surrounds the floating gate be about 8 nm or more. Thus, a limit of the scaling aiming at high speed and high integration is around the corner. Because of storage of an electric charge in a conductor, an oxide film defect acting as leak path easily exerts a bad influence, and in a memory cell involving an oxide film defect, its charge retention time is extremely deteriorated. On the other hand, the MONOS method is generally inferior in charge retention characteristic to the floating gate method and a threshold voltage tends to drop in terms of a logarithm of time. For this reason, although the MONOS method is an old-established method, it has so far been practically applied to only limited products. In the MONOS method, however, since an electric charge is stored in an insulator, a inherently strong resistance to an oxide film defect is attained; besides, a thin oxide film of 8 nm or less is also employable and is thus suitable for scaling, it is easy to predict reliability because an extreme deterioration of the charge holding life does not occur, and the memory cell structure is simple and easy to be mixed with a logical circuit section. Consequently, the MONOS method is again being noted with the recent progress of device scaling.

Particularly, as a split gate structure suitable for device scaling there is known a self-align structure wherein the MOS transistor is formed as a side wall (Patent Document 1 and Non-Patent Document 1). In this case, an alignment margin for photolithography is not necessary and the gate length of the transistor formed by self-alignment can be made below the minimum resolution size in lithography. Therefore, a finer memory cell can be implemented in comparison with the conventional structure wherein two types of transistors are each formed using another mask.

Among split gate type memory cells using self-alignment, for example the cell wherein a self-aligned gate side is formed by MONOS structure, which is disclosed in Non-Patent Document 2, is suitable for mixed mounting together with a high-speed logical circuit section. A section of this memory cell is shown in FIG. 1. On a side wall of a select gate 12 is formed a memory gate 11 by an ONO film comprising $SiO_2$ film 13, SiN film 14 and $SiO_2$ film 15 and by a polysilicon electrode of a side wall structure. A silicide layer 16-1 is formed over diffusion area 1, 5, select gate 12 and memory gate 11. An example of this structure is shown in Japanese Patent Application No. 2002-352040 filed by the same applicant as the applicant of the present case and which is pending.

According to the structure of this memory cell, the select gate side is formed first, so that a gate oxide of the select gate and a gate oxide film in the logical circuit section which is formed at the same time, can be formed in a high quality condition of a silicon substrate interface. Since a thin gate dielectric transistor for high-speed operation, which is sensitive to the interface quality, can be formed first, the performance of the logical circuit section and that of the select gate transistor to be mounted together are improved. Stored information can be read by only the operation of the select gate transistor of high performance, and since all of transistors connected thereto can also be formed as a low voltage type of thin gate dielectric, it is possible to attain both high speed read operation and reduction of the circuit area.

FIG. 2 shows an array using the split gate type MONOS memory cells in question. Each cell shares a diffusion area (hereinafter referred to as "source") adjacent to the memory gate 11 with an opposed memory cell and source lines 1 run in parallel with word lines. In the word line direction are arranged two types of word lines which as memory gate 2 type and select gate 3 type. Bit lines 4 perpendicular thereto are connected to diffusion areas ("drain" hereinafter) adjacent to the select gates 12 in the cells.

FIG. 3 shows typical voltage conditions in operation. Write is performed using a source side injection method (SSI method). That is, with about 12V and 5V applied to the memory gate and the source respectively, the select gate is inverted weakly and electrons are injected by a strong electric field developed between the select gate and the memory gate. Erase is performed by a hot hole injection method using a band-to-band tunneling (BTBT method). Reverse bias voltages of about −5V and 7V are applied to the memory gate and the source, respectively, and hot holes based on a band-to-band tunneling are created with a strong electric field developed at an end of the diffusion area and are injected into the memory gate. For reading stored information, 1.5V is applied to the memory gate and the select gate and 1V is applied to the drain and is made on the basis of the magnitude of an electric current flowing through the drain.

[Patent Document 1]
  Japanese Patent Laid Open No. Hei 5(1993)-48113 (FIG. 1)

[Patent Document 2]
  Japanese Patent Laid Open No. Hei 5(1993)-121700 (representative drawing and description of the prior art)

[Non-Patent Document 1]
  IEEE, VLSI Technology Symposium, 1994 Proceedings, pp. 71 to 72 (FIG. 1)

[Non-Patent Document 2]
  IEEE, VLSI Technology Symposium, 1997 Proceedings, pp. 63 to 64 (FIG. 1)

In this connection, there is a problem that when an arbitrary memory cell is to be written, another memory cell on the same word line is erroneously written or erased depending on a bias condition in the course of transition from a stand-by state to a bias condition in a write state. Conversely, also at the time of transition from a write state to a stand-by state, an erroneous write or erase can occur for the same reason. Such an unintended erroneous write or erase is generally called disturb. The disturb includes a disturb caused by a non-selection bias which a memory cell lying in an unselected position within an array receives and a sequence disturb caused by a time-oriented bias condition during rise or fall of bias to a write state.

The sequence disturb will here be explained in more detail. FIG. 3 illustrates typical operation conditions. In the same figure, Read, Write, and Erase, show conditions during read, write, and erase, respectively. Vmg stands for an applied voltage to a first gate (i.e., memory gate), Vs stands for an applied voltage to a first impurity-diffused region (i.e., generally source region), Vcg stands for an applied voltage to a second gate (i.e., selection gate), Vd stands for an applied voltage to a second impurity-diffused region (i.e., drain region), and Vsub stands for an applied voltage to the substrate.

When a change is made from a stand-by state to the write state bias shown in FIG. 3, write is performed word line by word line and therefore first the memory gate line, selection gate line and source line in the word line direction are allowed to rise to the write state bias. Since the lines are different in load capacity and driver circuits connected thereto are different in ability and since there is a circuit used in common, generally the lines are not allowed to rise simultaneously, but are allowed to rise and fall in accordance with a preset sequence. At this time, when the memory gate line is first allowed to rise at the potential on the memory transistor side, electrons are injected with an electric field developed by a potential difference between the memory gate and the substrate and there occurs an erroneous write in a time zone until rise of the source line. Conversely, when the source line is first allowed to rise, a strong electric field is developed in the source-side diffusion layer in a time zone until rise of the source line and there occurs a weak BTBT hot hole injection (i.e., hot hole injection caused by a band-to-band tunneling) with consequent occurrence of an erroneous erase.

FIG. 4 shows schematically a relation between bias conditions and the resulting disturb, in which a memory gate voltage Vmg is plotted along the axis of ordinate and a source voltage Vs is plotted along the axis of abscissa. The units are all V. In a region 21 appearing in the same figure, there occurs Fowler-Nordheim (FN) tunneling electron injection with a high electric field on the memory gate side and the threshold voltage rises, that is, an erroneous write occurs. A region 22 is used for write under the condition that source-side injection (SSI) occurs depending on the electric current in the selection transistor. In a region 23, there occurs a lowering of the threshold voltage, that is, an erroneous erase occurs, because there occurs BTBT hot hole injection with the electric field of the source diffusion area or region. In transition from a stand-by state 24 to a write state 25, a path 26 in which Vmg is first allowed to rise passes the region 21 and therefore an erroneous write occurs, while a path 27 in which Vs is first allowed to rise passes the region 23 and therefore an erroneous erase occurs. Also at the time of voltage fall there occurs a sequence-based disturb for the same reason.

More particularly, a memory cell in which the threshold voltage drops due to the sequence disturb is an already-written memory cell on a selected word line, and the threshold voltage drops when the word line rising or falling bias passes the region 23 in FIG. 4. Conversely, a memory cell in which the threshold voltage rises is a memory cell which is in an erased state on a selected word line, and the threshold voltage rises when the word line rising or falling bias passes the region 21 in FIG. 4.

FIGS. 5 and 6 show measurement results of disturb quantities in the regions 21 and 23, respectively, in FIG. 4. In FIG. 5, the bias condition corresponds to the region 21 of Vmg=14V, Vs=1.5V and the axis of abscissa represents a data disturb time, while the axis of ordinate represents a threshold voltage in a state of erase. The threshold voltage in a state of erase rises at a disturb time of 10 μsec or more. Likewise, in FIG. 6, the bias condition corresponds to the region 23 in FIG. 4 with Vmg 1.5V, Vs=5V, and the threshold voltage in a state of write drops at a disturb time of 100 μsec or more. Since a series of operations for setting each terminal to a write state and resetting to the stand-by state requires a time of about 10 to 100 μsec, the above sequence disturbs can be a problem.

Further, the disturb of the sequence increases in proportion as the number of times of rise and fall of the word line increases. In verifying, write and read are repeated until the threshold voltage reaches a predetermined value, so that the rise and fall of the word line voltage are performed frequently and the disturb becomes more influential. The conventional circuit configuration requires that write be performed for alternate bit lines. Also in such a case, for write of one word line, rise and fall of the word line voltage are performed at least twice at both even- and odd-numbered bits and therefore the disturb of the sequence is more strongly influential.

Generally, the threshold voltage changes toward a thermal equilibrium state with the lapse of time, but if the threshold voltage is lower or higher than a value which has been set taking the charge holding life into account, information which has been stored within the life time is lost, that is, the reliability is deteriorated.

SUMMARY OF THE INVENTION

To solve the above mentioned problems the present invention provides a non-volatile semiconductor memory device wherein the voltage application sequence of a word line bias in writing is set so as to avoid a disturb region.

First, the present invention is extremely useful as a non-volatile semiconductor memory device having a paralleled form of memory cells and in which a connected direction of a plurality of first gate electrodes and that of a plurality of first impurity diffusion regions are parallel to each other. A concrete example of a memory cell applied to the present invention comprises a first impurity diffusion region and a second impurity diffusion region both provided on a semiconductor substrate, a channel region sandwiched in between the first and second impurity diffusion regions, a first gate electrode (i.e., so-called memory gate) provided over the channel region on the side close to the first impurity diffusion region through a charge storage layer, and a second gate electrode (i.e., so-called selection gate) provided over the channel region on the side close to the second impurity diffusion region through a gate insulating film. As noted above, the non-volatile semiconductor device has a memory cell group comprising a plurality of connected memory cells. Further, the present invention has a form in which a connected direction of a plurality of first gate electrodes and that of a plurality of first impurity diffusion regions are the same.

A basic construction of the present invention is characterized in that, in connection with the application of a potential to a first gate electrode and the application of a potential to a first impurity diffusion region, at least one of the potential (Vmg) applied to the first gate electrode and the potential (Vs) applied to the first impurity diffusion region is increased, and before arrival at predetermined potentials required of both potentials, the potential not having been subjected to the potential change out of the potential applied to the first gate electrode and the potential applied to the first impurity diffusion region is caused to rise, thereby obtaining predetermined potential states in the memory cell concerned.

More specifically, in a first aspect of the present invention there is provided a non-volatile semiconductor memory device wherein, in connection with the application of a potential to a first gate electrode and the application of a potential to a first impurity diffusion region, either the potential (Vmg) applied to the first gate electrode or the potential (Vs) applied to the first impurity diffusion region is made a desired potential required of it, then in this state, the potential not having been set to the desired potential out of the potential of the first gate electrode and that of the first impurity diffusion region is increased, and after this potential exceeds a desired potential (Vs1 or Vmg2), the potential having been set to the desired potential out of the potential of the first gate electrode and that of the first impurity diffusion region is increased, thereby applying a write potential to the memory cell concerned.

A second aspect of the present invention is characterized in that, in connection with the application of a potential to a first gate electrode and the application of a potential to a first impurity diffusion region, at least one of the potential (Vmg) applied to the first gate electrode and the potential (Vs) applied to the first impurity diffusion region is decreased, and before arrival at predetermined potentials required of both potentials, the potential not having been subjected to the potential change out of the potential applied to the first gate electrode and the potential applied to the first impurity diffusion region is decreased, thereby obtaining predetermined potential states in the memory cell concerned.

According to a more concrete typical example, in the first aspect of the present invention, in connection with the application of a potential to the first impurity diffusion region and the application of a potential to the first gate electrode, either the potential (Vs) applied to the first impurity diffusion region or the potential (Vmg) applied to the first gate electrode is made a set potential (Vs or Vmg), then in this state the potential not having been made the set potential out of the potential applied to the first impurity diffusion region and the potential applied to the first gate electrode is decreased, and after this potential exceeds a desired potential (Vmg1 or Vs2), the potential having been made the set potential out of the potential applied to the first impurity diffusion region and the potential applied to the first gate electrode is decreased, thereby changing the write potential in the memory cell concerned into another potential state.

A third aspect of the present invention comprises a process wherein, in connection with the application of a potential to a first gate electrode and the application of a potential to a first impurity diffusion region, for example the potential applied to the first impurity diffusion region is increased, and before completion of the increase in potential of the first impurity diffusion region from a first predetermined potential to a second predetermined potential, the potential of the first gate electrode is increased, thereby bringing the memory cell concerned into an applied state of a first intermediate potential. Preferably, the potential of the first impurity diffusion region is fixed to the first predetermined potential, the potential of the first gate electrode is increased, then upon arrival at a desired potential as a second intermediate point the potential of the first impurity diffusion region is increased again, and both the potential of the first gate electrode and that of the first impurity diffusion region are allowed to reach the final potential. Where required, the number of the aforesaid intermediate point may be increased to a larger number of points.

A fourth aspect of the present invention comprises a process of decreasing the potential of a first impurity diffusion region before completion of a potential decrease of a first gate electrode from a second predetermined potential to a first predetermined potential, thereby bringing the memory cell concerned into an applied state of an intermediate potential. Preferably, the potential of the first impurity diffusion region is fixed to a desired potential, the potential of the first gate electrode is decreased, then upon arrival at a desired potential as a second intermediate point the potential of the first impurity diffusion region is decreased to a desired potential, e.g., zero volt, and only the potential of the first gate electrode is decreased, allowing both the potential of the first gate electrode and the potential of the first impurity diffusion region to reach the final potential. Where required, the number of the aforesaid intermediate point may be increased to a larger number of points.

According to the present invention it is possible to provide a non-volatile semiconductor memory device able to avoid the occurrence of a write sequence disturb. Further, it is possible to provide a non-volatile semiconductor memory device improved in rewrite resistance.

BRIEF DESCRIPTION OF THE DRAWINGS

FIG. 3 is a list of typical operation conditions;

DETAILED DESCRIPTION OF THE INVENTION

Typical modes of the present invention have been described above. Prior to explaining embodiments of the present invention, a description will be given below by way of concrete examples with respect to basic operations, etc.

Figure 1:
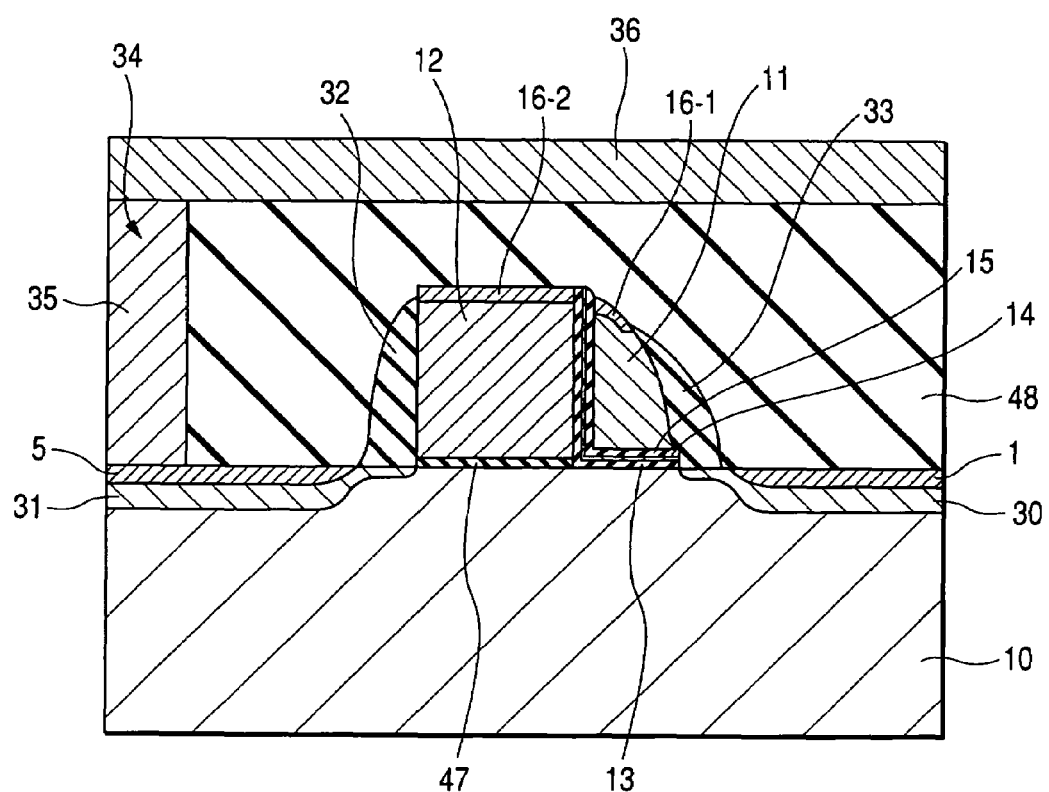
FIG. 1 is a sectional view of a MONOS memory cell of a split gate structure.

As an example of a memory cell, the example of FIG. 1 which shows a section of the cell is basically sufficient. That is, a first impurity diffusion region 30 and a second impurity diffusion region 31 are formed on a semiconductor substrate 10. Usually, silicidation regions 1 and 5 are formed in internal regions of the impurity diffusion regions. Such a construction concerns a technique commonly adopted for semiconductor devices and therefore the details thereof will here be omitted.

A channel region is formed between the first and second impurity diffusion regions 30 and 31, and a second electrode (i.e., so-called selection gate) 12 is formed over the channel region through a gate insulating film 47. On a side wall of the second gate electrode (selection gate) 12 is formed a memory gate 11 by a so-called ONO film, the ONO film comprising $SiO_2$ film 13, SiN film 14 and $SiO_2$ film 15, and a polysilicon electrode of a side wall structure. Insulating films 33 and 32 for passivation are formed respectively on the other side walls of the first and second gate electrodes 11 and 12. Silicide layers 16-1 and 16-2 are formed over the impurity diffusion layers 30, 31, the selection gate 12 and memory gate 11. At the same time, silicidation regions 1 and 5 are formed in internal regions of the impurity diffusion regions. These silicide layers serve as lead-out conductor layers for various portions.

The above memory cell portions are covered with an insulator layer 48, a contact hole 34 is formed in each required portion and a conductor layer 35 for contact is formed in the interior of the contact hole 34. The contact layer 35 is connected to a wiring layer 36.

Figure 2:
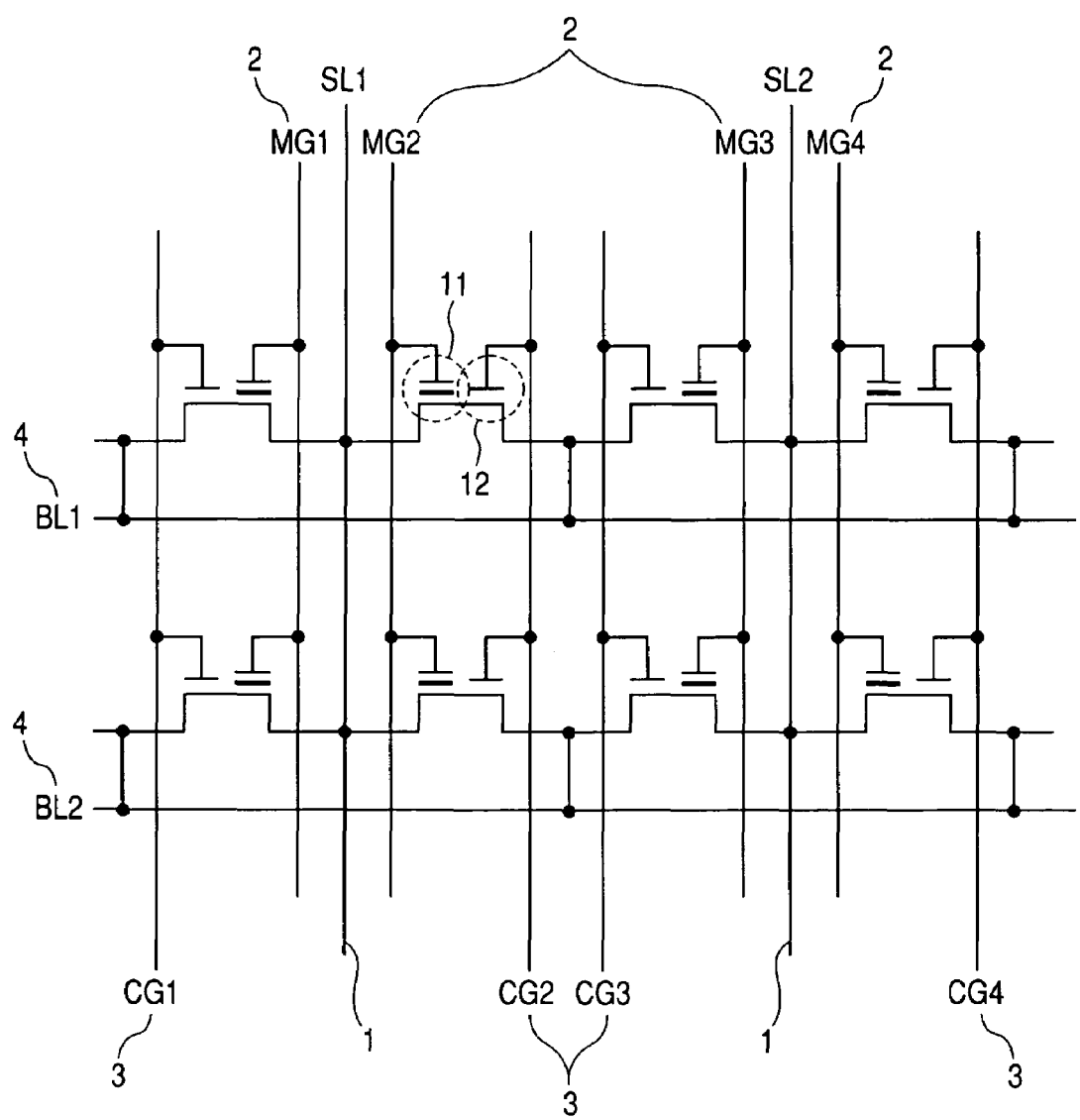
FIG. 2 is a construction diagram of a memory array to which the present invention is applied.
Figure 14:
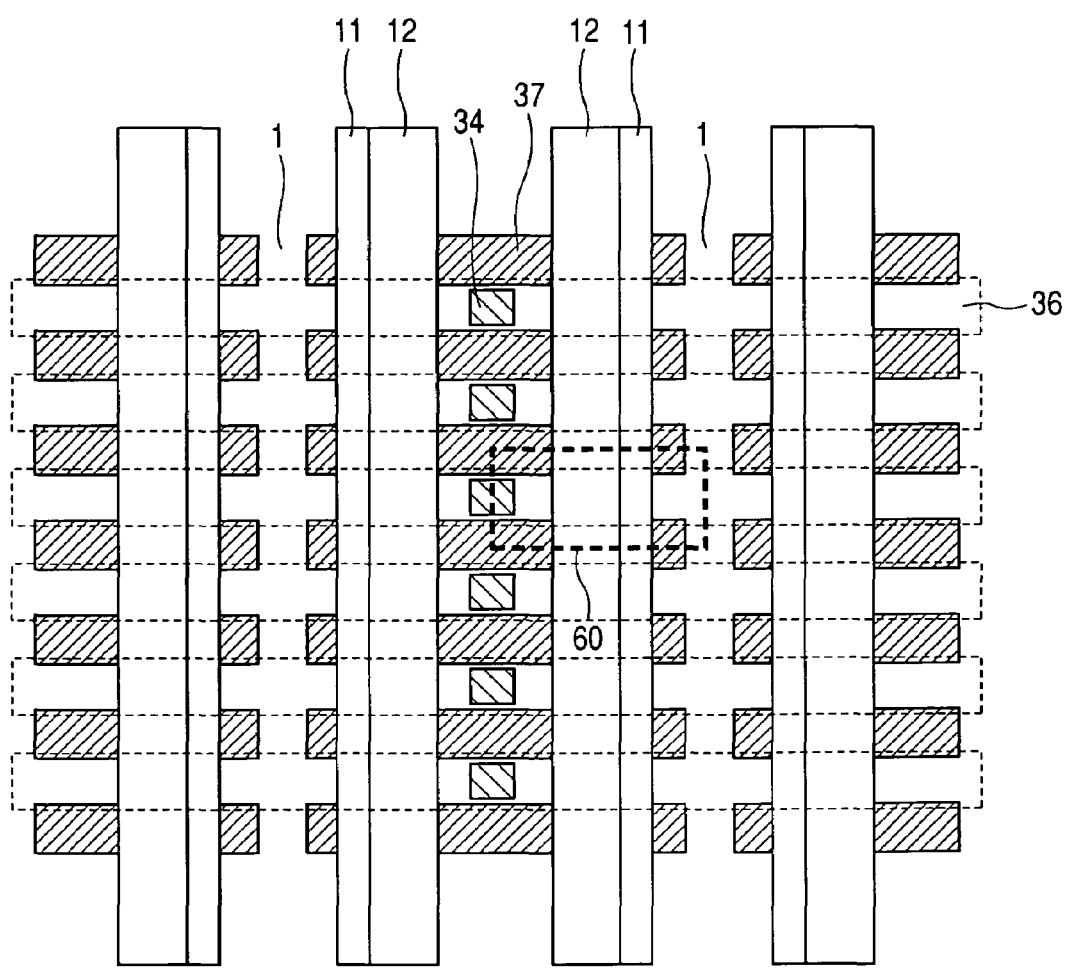
FIG. 14 shows an example of a plane layout of a memory array portion.

As a typical example of an array configuration of a non-volatile semiconductor memory device, the one shown in FIG. 2 suffices. A plan layout corresponding to this configuration example is shown in FIG. 14. As noted earlier, this example is an array configuration using split gate type MONOS memory cells. Memory cells each represented by the first and second gate electrodes 11 and 12 are arranged in matrix form. Each memory cell shares an impurity diffusion layer ("source" hereinafter) adjacent to the memory gate 11 with an opposed memory cell and source lines 1 (SL1, SL2) run in parallel with two types of word lines. More specifically, two types of word lines which are memory gates 2 (MG1, MG2, MG3, MG4) and selection gates 3 (CG1, CG2, CG3, CG4) are arranged in the word line direction. Bit lines 4 (BL1, BL2) perpendicular to the word lines are connected to impurity diffusion layers ("drain" hereinafter) adjacent to the selection gates 12 of the memory cells. Thus, in the illustrated example, plural memory cells are connected in parallel in one direction. As noted above, the direction in which a plurality of memory gates (i.e., the first gate electrodes) are connected and the direction in which a plurality of first impurity diffusion regions (e.g., sources) are connected are the same.

The memory element configuration of the present invention is fully understood from this array configuration and with reference to the sectional view of FIG. 1 and the plane layout of FIG. 14. Unit memory cells 60 are arranged in matrix form on the substrate surface and in regions isolated by device isolation regions 37. A unit memory cell enclosed with a dotted line corresponds to the sectional view of FIG. 1. Numeral 36 denotes a wiring layer, which is connected to the conductor layer 35 for contact within the contact hole 34. Numerals 11 and 12 denote a memory gate, a selection gate, and a silicidation region in the first impurity diffusion region 1, respectively.

Figure 4:
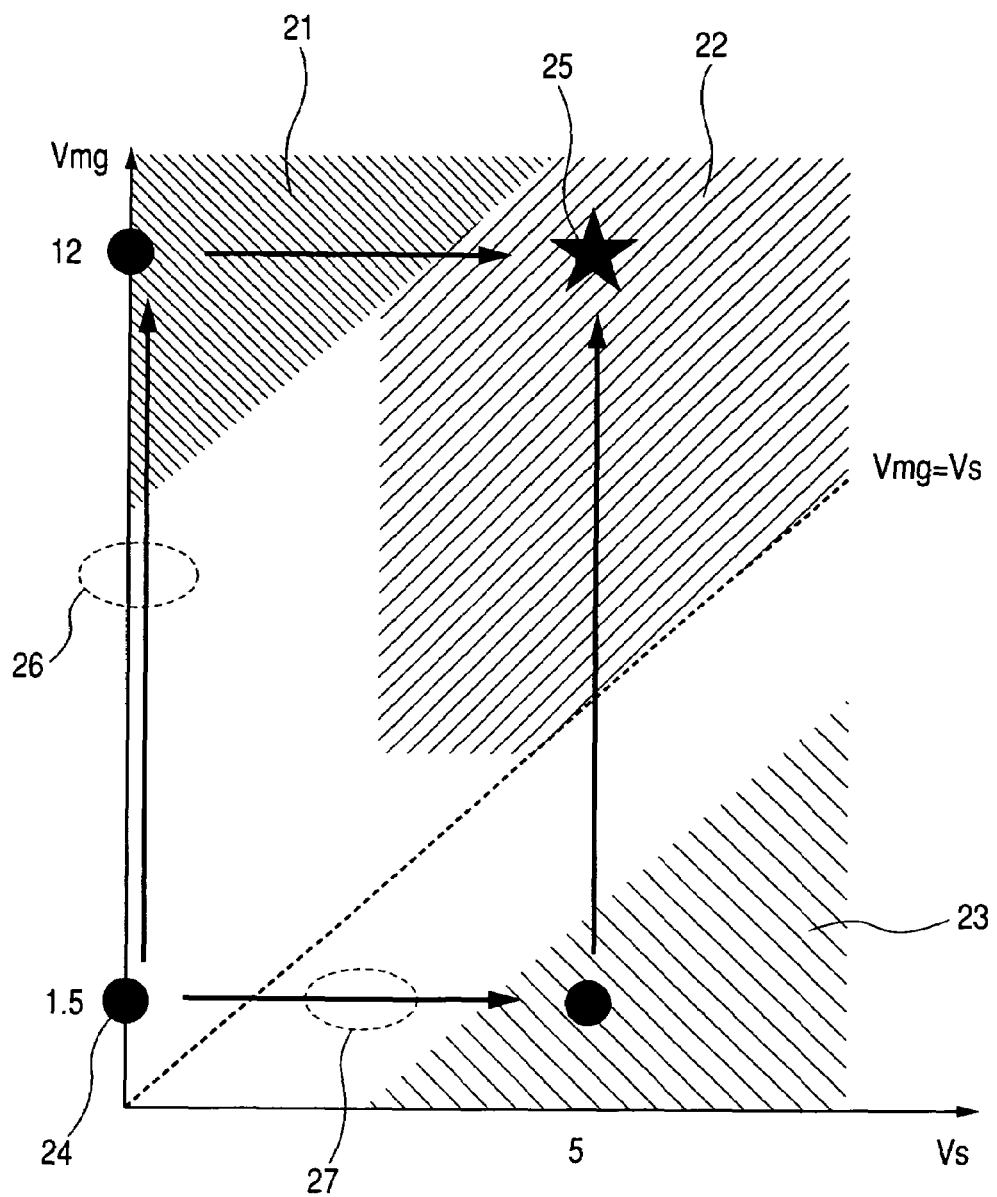
FIG. 4 is an explanatory diagram of a bias transition path as a conventional example.
Figure 5:
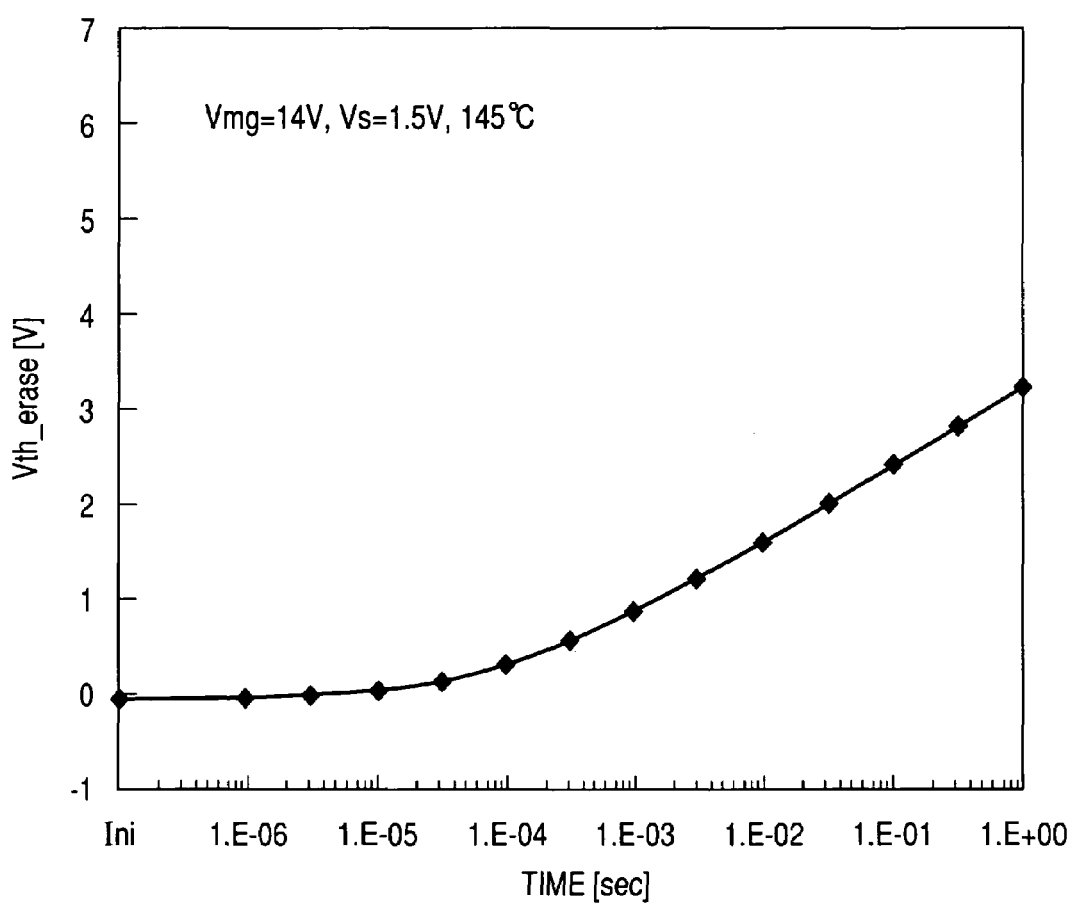
FIG. 5 is a diagram showing an example of measured data on disturb of a threshold voltage rise region by FN electron injection.
Figure 6:
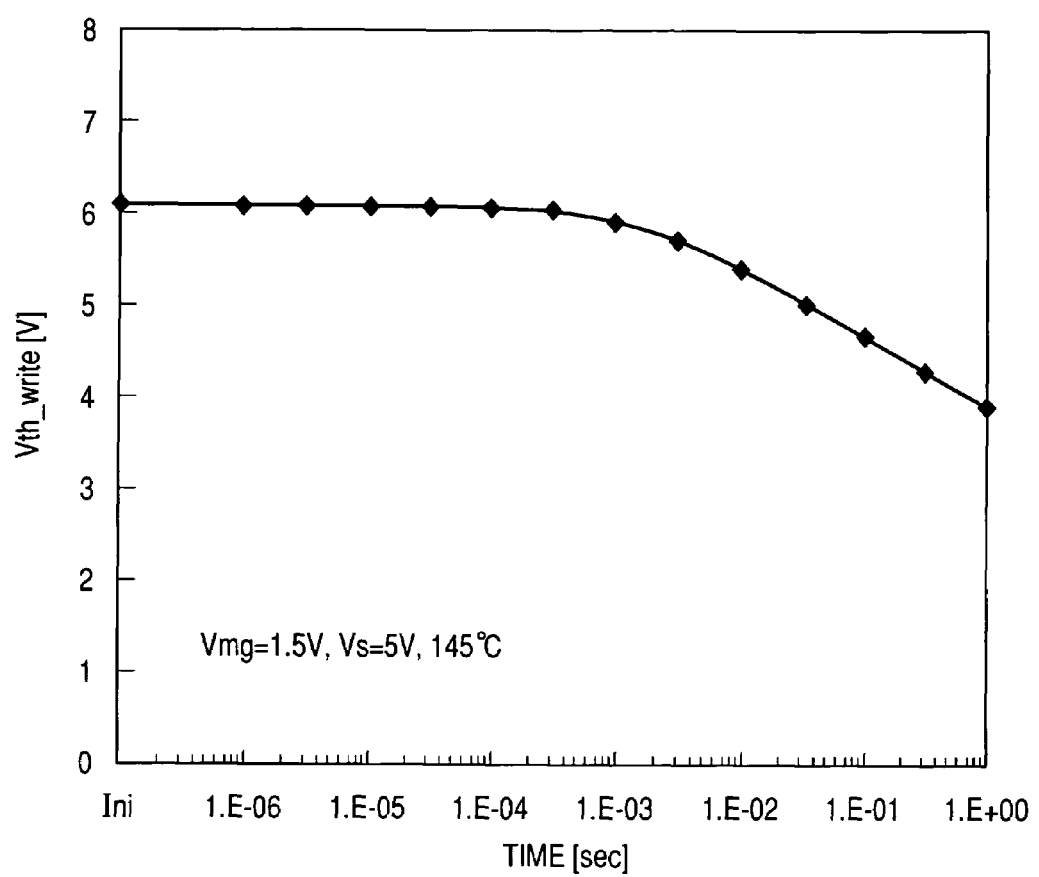
FIG. 6 is a diagram showing an example of measured data on disturb of a threshold voltage drop region by BTBT hot hole injection.

Next, a concrete example of a rise and fall sequence according to the present invention will be described in detail. As to potential changes, a detailed explanation thereof will here be omitted because such changes can be done by conventional means. First, according to a word line bias rise method, a diffusion layer voltage ("Vs" hereinafter) on the memory transistor side is increased from a stand-by voltage, and after Vs exceeds a certain intermediate-stage value Vs1, a gate voltage ("Vmg" hereinafter) of the memory transistor is increased. According to a word line bias fall method, the gate voltage Vmg of the memory transistor is decreased from a write voltage, and after Vmg passes a certain intermediate-stage value Vmg1, the diffusion layer voltage Vs on the memory transistor side is decreased. In this way it is possible to avoid the region 23 in FIG. 4 in which the threshold voltage drops.

According to another word line bias rise method, the gate voltage Vmg of the memory transistor is increased, and after Vmg exceeds a certain intermediate-stage value Vmg2, the diffusion layer voltage Vs on the memory transistor side is increased. Likewise, according to another word line bias fall method, the diffusion layer voltage Vs on the memory transistor side is decreased from the stand-by voltage, and after Vs passes a certain intermediate-stage value Vs2, the gate voltage Vmg of the memory transistor is decreased. In this way it is possible to avoid the region 21 in FIG. 4 in which the threshold voltage rises.

Figure 13:
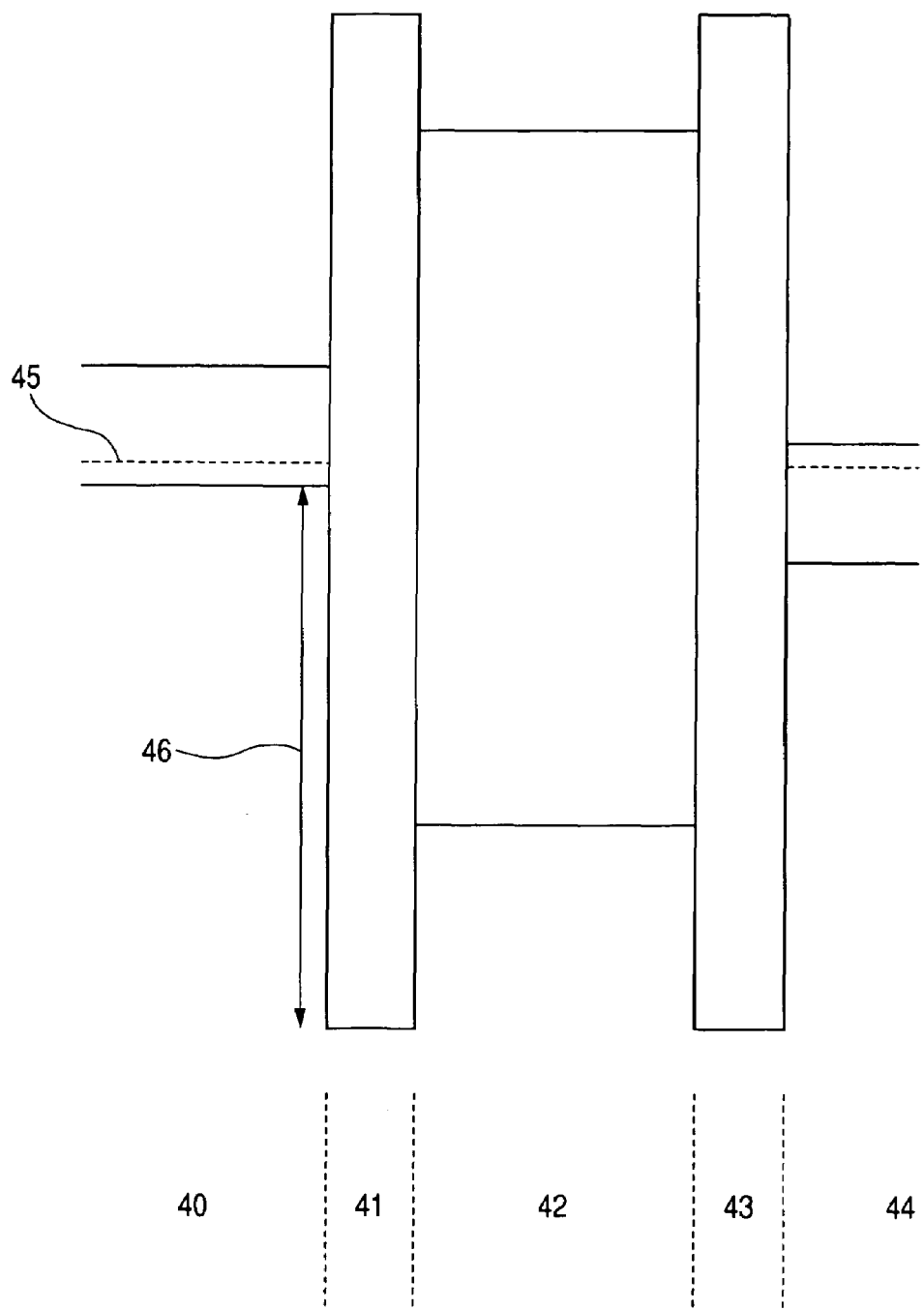
FIG. 13 is an explanatory diagram of a potential barrier against holes in the present invention.

The intermediate-stage diffusion layer voltage Vs1 defined in the above first method is assumed to be a smaller voltage than a voltage (Vs1th) which corresponds to the height of the potential barrier against holes in the insulating film material as seen from the substrate material. In case of forming a gate insulating film as a silicon oxide film on a silicon substrate, the value of Vs1th is 3 to 5V. This value is based on a substrate potential of 0V. In case of applying an arbitrary substrate potential, there may be applied a voltage of a relative value based on the substrate potential and corresponding to the aforesaid height of the potential barrier against holes in the gate insulating film material as seen from the substrate material. By so doing, the diffusion layer voltage takes a value of a range in which generated holes are not injected into the gate insulating film beyond the potential barrier, so that it is possible to prevent the occurrence of an erroneous erase caused by the injection of holes. FIG. 13 is a schematic band structure diagram of the potential barrier against holes, showing associated relations. In the same figure, the region indicated by numeral 40 denotes a silicon substrate, numeral 41 denotes a bottom oxide film, numeral 42 denotes a charge storage layer, 43 a top oxide film, 44 a gate electrode, 45 Fermi level, and 46 a potential barrier against holes.

The intermediate-stage voltage Vmg in the above first method is assumed to be a larger value than Vsw−Vs1th (=Vmg1th), assuming that the memory transistor diffusion layer voltage in a state of write is Vsw. Since this value is of a range in which a potential difference between the memory gate and the diffusion layer does not exceed the potential barrier against holes as in the above case, it is possible to prevent the occurrence of an erroneous erase caused by the injection of holes. Vs1th is a voltage corresponding to the foregoing height of the potential barrier against holes in the gate insulating film material as seen from the substrate material.

The intermediate-stage gate voltage Vmg2 of the memory transistor gate defined in the above second method may be set at a smaller value than the voltage Vmg2th corresponding to an electric field of 6 MV/cm in the gate insulating film of the memory transistor. Vmg2th can be determined by both the gate voltage Vmg based on the substrate potential and the thickness of the gate insulating film. If Vmg2th is below 6 MV/cm, it is possible to suppress the injection of electrons into the gate insulating film by the Fowler-Nordheim (FN) tunnel current and hence possible to prevent the occurrence of an erroneous write.

The intermediate-stage diffusion layer voltage Vs2 defined in the above second method is assumed to be a larger value than Vmgw−Vmg2th (=Vs2th), assuming that the gate voltage of the memory transistor in a state of write is Vmgw. By so doing, as in the above case, the electric field in the gate insulating film takes a value of a range in which the injection of electrons into the gate insulating film by the Fowler-Nordheim (FN) tunnel current does not occur, and thus it is possible to prevent the occurrence of an erroneous write.

Figure 7:
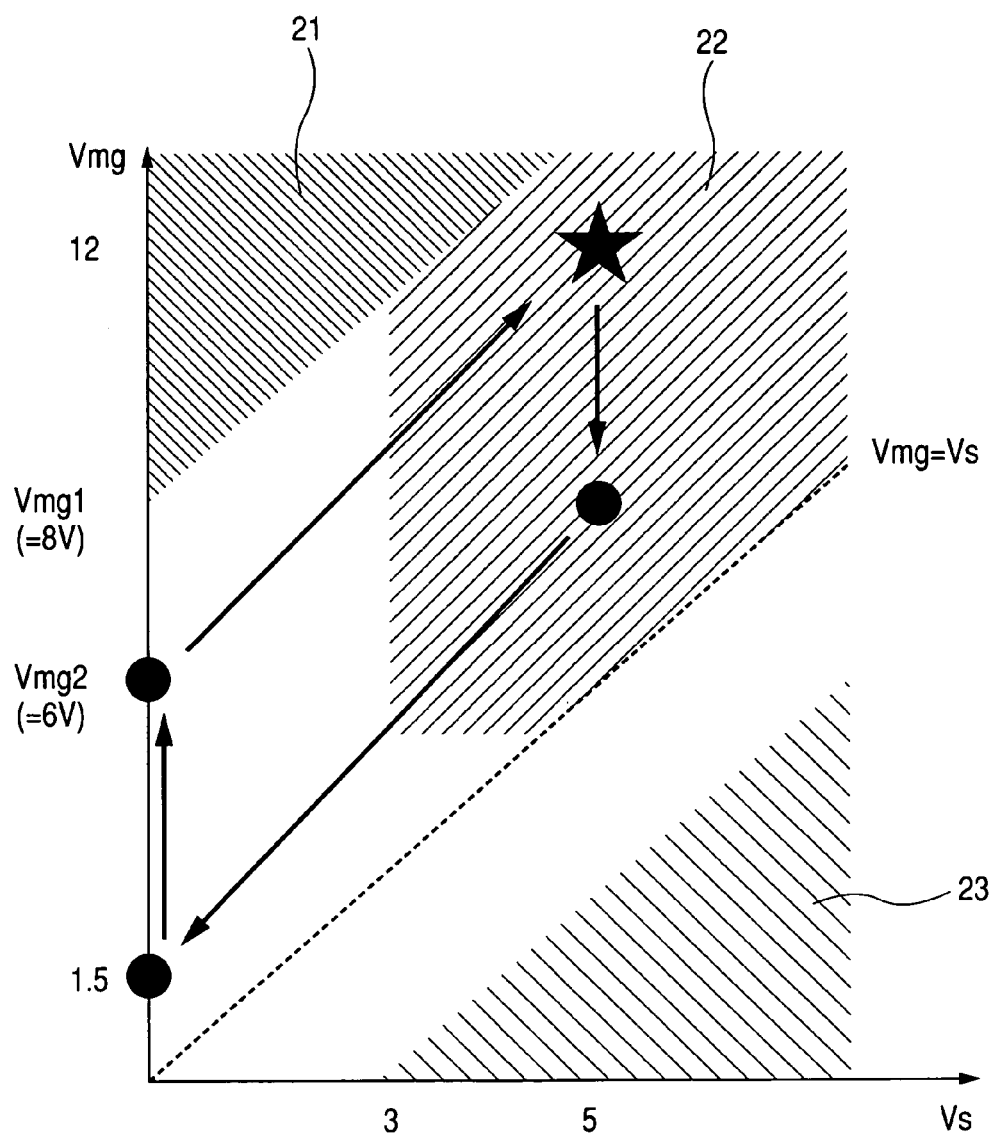
FIG. 7 is an explanatory diagram of a bias transition path in a first embodiment of the present invention.

Next, a first embodiment of the present invention will be described. The memory cell is an MONOS memory cell of the split gate structure shown in FIG. 1, and an array configuration is as shown in FIG. 2. Voltage conditions for read, write and erase are as shown in FIG. 3. FIG. 7 is a phase diagram of a transition path in which the gate voltage Vmg and the diffusion layer voltage Vs in the memory transistor are changed between stand-by state and write state. In the same figure, the diffusion layer voltage Vs and the gate voltage Vmg are plotted along the axis of abscissa and the axis of ordinate, respectively. As is the case with FIG. 4, the region 21 is a region in which there occurs an erroneous write, the region 22 is a region used for write under the condition that there occurs source side injection (SSI) depending on the current of the selection transistor, and the region 23 is a region in which there occurs an erroneous erase.

When the memory cells are unselected and are in a stand-by state, Vmg=1.5V, Vs=0V, and if a word line is selected in this state, first Vmg is allowed to rise while Vs remains fixed. The value of Vmg is monitored and when it exceeds Vmg2 as a determination voltage, this time point is made a trigger point and Vs is also started to rise. The value of Vmg2 is determined in accordance with the thickness of the gate insulating film. It may be set so that the electric field in the gate insulating film takes such a value as does not cause electron injection by Fowler-Nordheim (FN) tunnel current. For example, 6V is selected. In this case, the gate insulating film of the memory transistor has a three-layer structure of $SiO_2$ film/SiN film/$SiO_2$ film, which are 4 nm/10 nm/5 nm thick successively from below.

Figure 8:
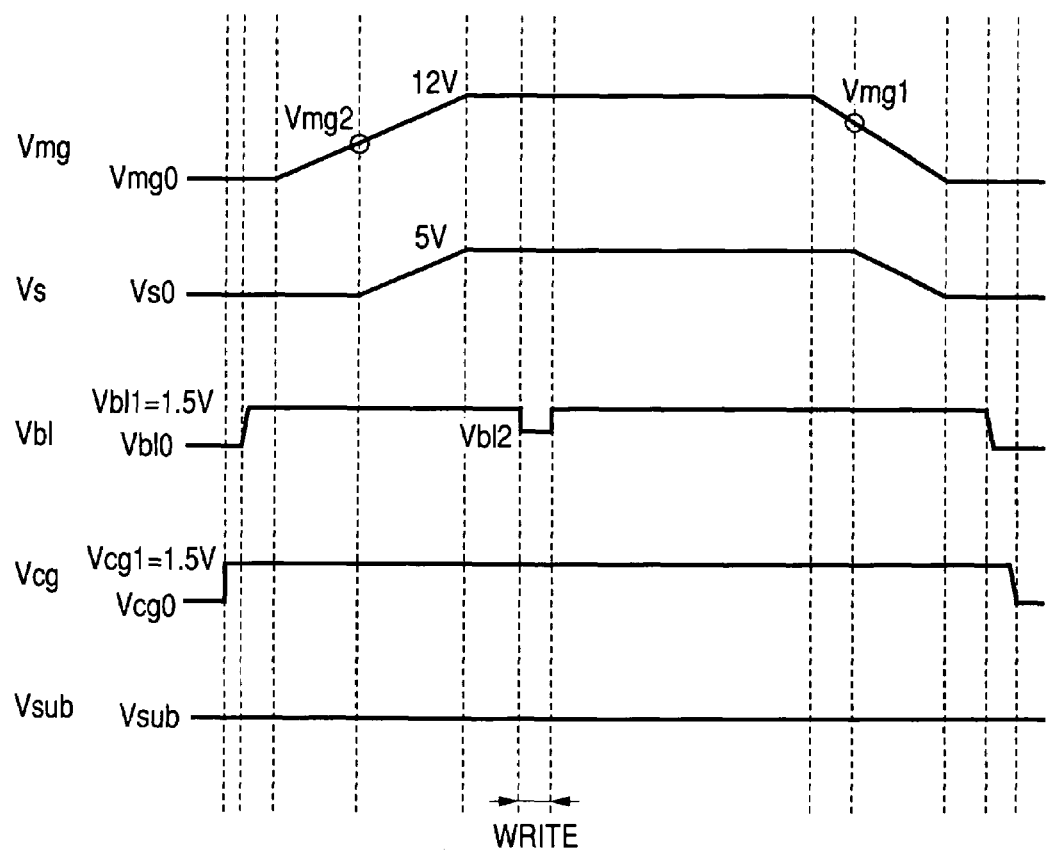
FIG. 8 is an explanatory diagram of a time series of bias changes in the first embodiment.

It is FIG. 8 that arranges this sequence in terms of a time series for each terminal including selection gate and substrate. In FIG. 8, the reference marks Vmg, Vs, Vcg and Vsub are as explained above. Vb1 denotes a potential of a selected bit line. After Vmg and Vs have reached write potentials of 12V and 5V, respectively, the potential Vb1 of a selected bit line is controlled to make write to the selected bit. Vb1 is 1.5V in a stand-by state, which is equal to Vcg1. In this state, write does not occur because there is no flow of an electric current in the channel of the selection transistor. If the bit line potential of a selected bit is dropped to about 1V as Vb12, there flow a channel current in the selection transistor, thus making write possible. After completion of write to all of predetermined bits on the selected word line, fall is started.

In fall, first Vmg is decreased while keeping Vs fixed. When Vmg exceeds Vmg1 as a determination voltage, this time point is made a trigger point and fall is started. The value of Vmg1 may be set at a value of a range in which the potential difference Vs−Vmg between memory gate and diffusion layer does not exceed a potential barrier (3V-5V) against holes, whereby an erroneous erase caused by the injection of holes can be prevented. For example, 8V is selected as Vmg1. In this first embodiment, the gate voltage Vmg of the memory transistor is used as a determination voltage in common to both rise and fall, whereby the circuit configuration can be simplified.

Figure 9:
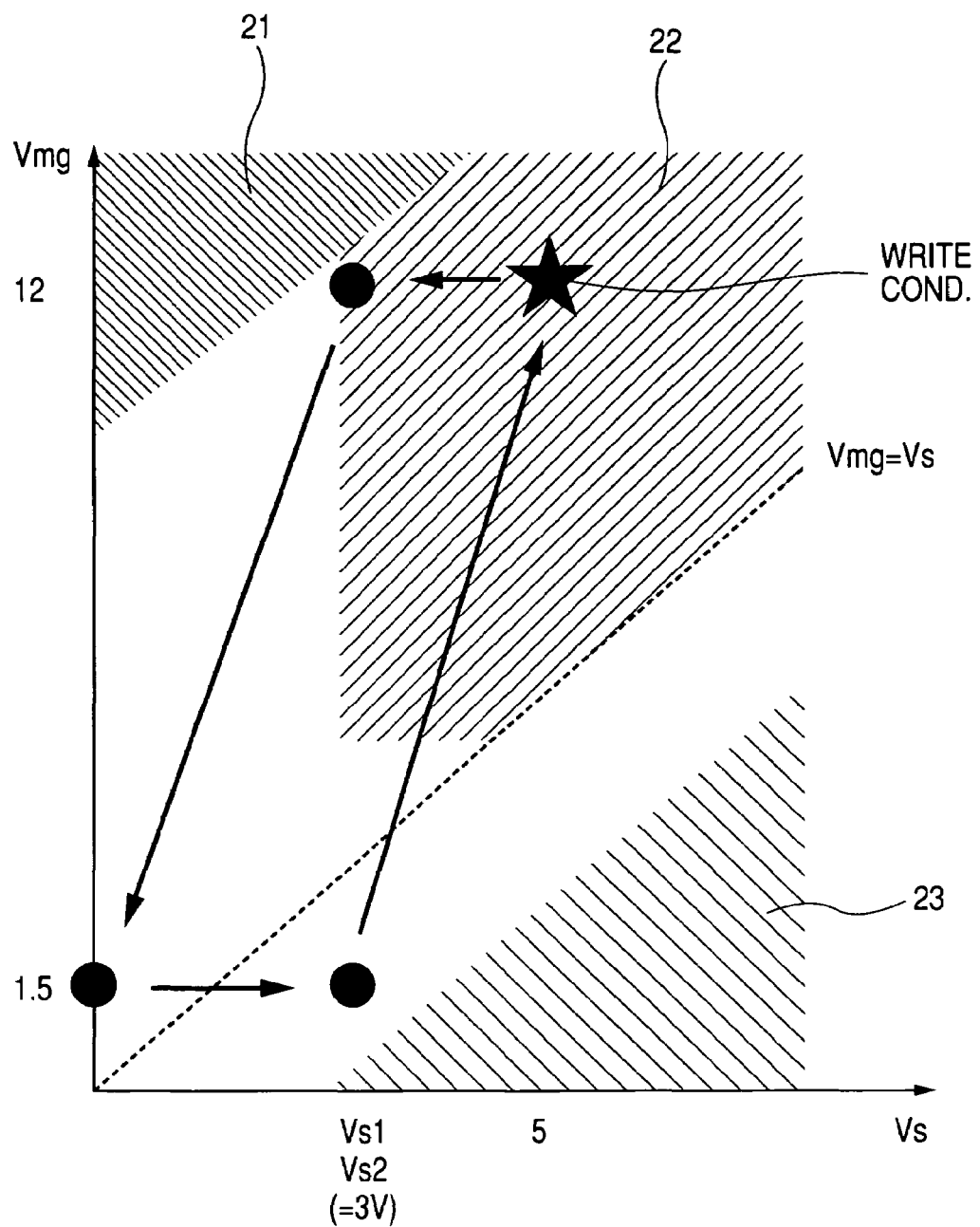
FIG. 9 is an explanatory diagram of a bias transition path in a second embodiment of the present invention.

Description is now directed to a second embodiment of the present invention, which is the same in memory cell and array configuration as the first embodiment. FIG. 9 is a phase diagram of a transition path of both gate voltage Vmg and diffusion layer voltage Vs in a memory transistor according to the second embodiment. In FIG. 9, the axis of abscissa represents the diffusion layer voltage Vs and the axis of ordinate represents the gate voltage Vmg. As in FIGS. 4 and 7, the region 21 is a region in which an erroneous write occurs, the region 22 is a region capable of being used for write, and the region 23 is a region in which an erroneous erase occurs.

When the memory cells are unselected and are in a stand-by state, Vmg=1.5V, Vs=0V, and if a word line is selected in this state, first Vs is allowed to rise while Vmg remains fixed. The value of Vs is monitored and when it exceeds Vs1 as a determination voltage, this time point is made a trigger point and Vmg is also started to rise. The value of Vs1 may be set at a value of a range in which the potential difference Vs−Vmg between diffusion layer and memory gate does not exceed a potential barrier (3V to 5V) against holes, whereby it is possible to prevent the occurrence of an erroneous erase caused by the injection of holes. For example, 3V is selected as Vs1.

After the write conditions of Vmg 12V and Vs 5V have been reached and write has been performed in the same way as in the first embodiment, fall is allowed to start in which first Vs is decreased while keeping Vmg fixed. With the time point of Vs exceeding the determination voltage of Vs2 as a trigger point, fall of Vmg is started. The value of Vs2 may roughly be set at a value of a range in which the intensity of the electric field in the gate insulating film proportional to (Vmg−Vs) does not cause electron injection by Fowler-Nordheim (FN) tunnel current. For example, 3V is selected. According to the construction of this second embodiment, the diffusion layer voltage Vs is used as a determination voltage in common to both rise and fall and the value of the rise determining voltage Vs and that of the fall determining voltage Vs2 are made equal to each other, whereby the circuit configuration can be simplified.

Figure 10:
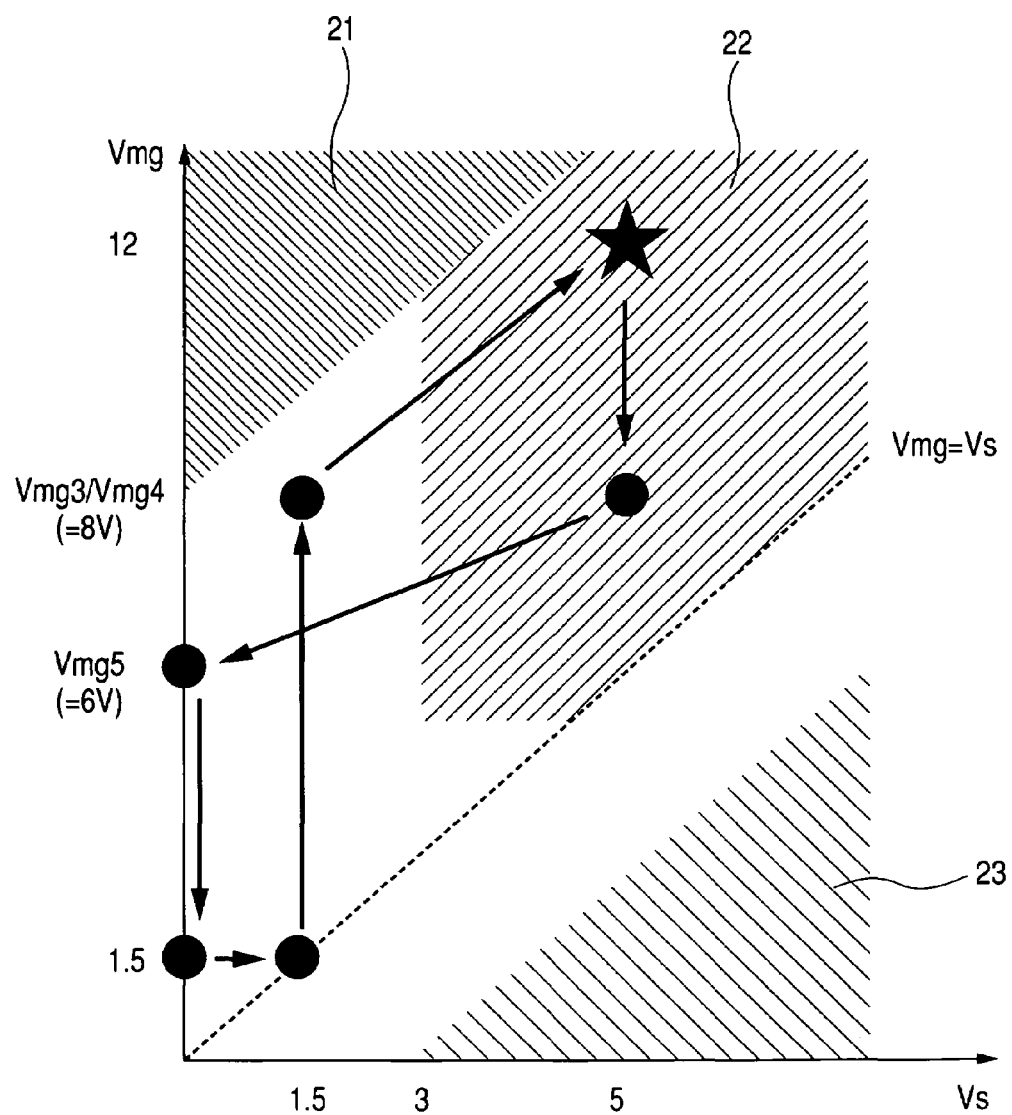
FIG. 10 is an explanatory diagram of a bias transition path in a third embodiment of the present invention.

A third embodiment will now be described, which is the same in memory cell and array construction as the first embodiment. FIG. 10 is a phase diagram of a transition path of both gate voltage Vmg and diffusion layer voltage Vs in a memory transistor according to the third embodiment, in which the diffusion layer voltage Vs and the gate voltage Vmg are plotted along the axis of abscissa and the axis of ordinate, respectively. As in FIGS. 4 and 7, the region 21 is a region in which an erroneous write occurs, the region 22 is a region used for write, and the region 23 is a region in which an erroneous erase occurs.

When the memory cells are unselected and are in a stand-by state, Vmg=1.5V, Vs=0V. In this state, only Vs is raised to 1.5V. In this embodiment the diffusion layer voltage of unselected cells during write is 1.5V and at this time point the diffusion layer voltage within the array is all set to 1.5V. Thereafter, with Vs fixed, only Vmg is allowed to rise. At this time, the value of Vmg is monitored and with the value of Vmg exceeding a determining voltage of Vmg3 as a trigger point, Vs is also started to rise. The value of Vmg3 is determined in accordance with the thickness of the gate insulating film. It may be set at a value of a range in which the electric field in the gate insulating film does not cause electron injection by Fowler-Nordheim (FN) tunnel current. For example, 8V is selected.

After the write conditions of Vmg 12V and Vs 5V have been reached and write has been performed in the same way as in the first embodiment, fall is started, in which first Vmg is decreased while keeping Vs fixed. While monitoring the value of Vmg, with the time point of the value of Vmg exceeding a determining voltage of Vmg4 as a trigger point, fall of Vs is also started. The value of Vmg4 may be set at a value of a range in which the potential difference Vs−Vmg between memory gate and diffusion area does not exceed a potential barrier (3V to 5V) against holes, whereby an erroneous erase caused by the injection of holes can be prevented. As Vmg4 there is selected 8V which can share the determination voltage with Vmg3. Subsequently, both Vmg and Vs are allowed to fall and the fall is stopped temporarily when the value of Vmg reaches a determination voltage of Vmg5. That the intermediate point Vmg5 is set is for the purpose of preventing Vmg from lowering before drop of Vs and approaching the region 23 with a consequent decrease of threshold voltage.

Figure 11:
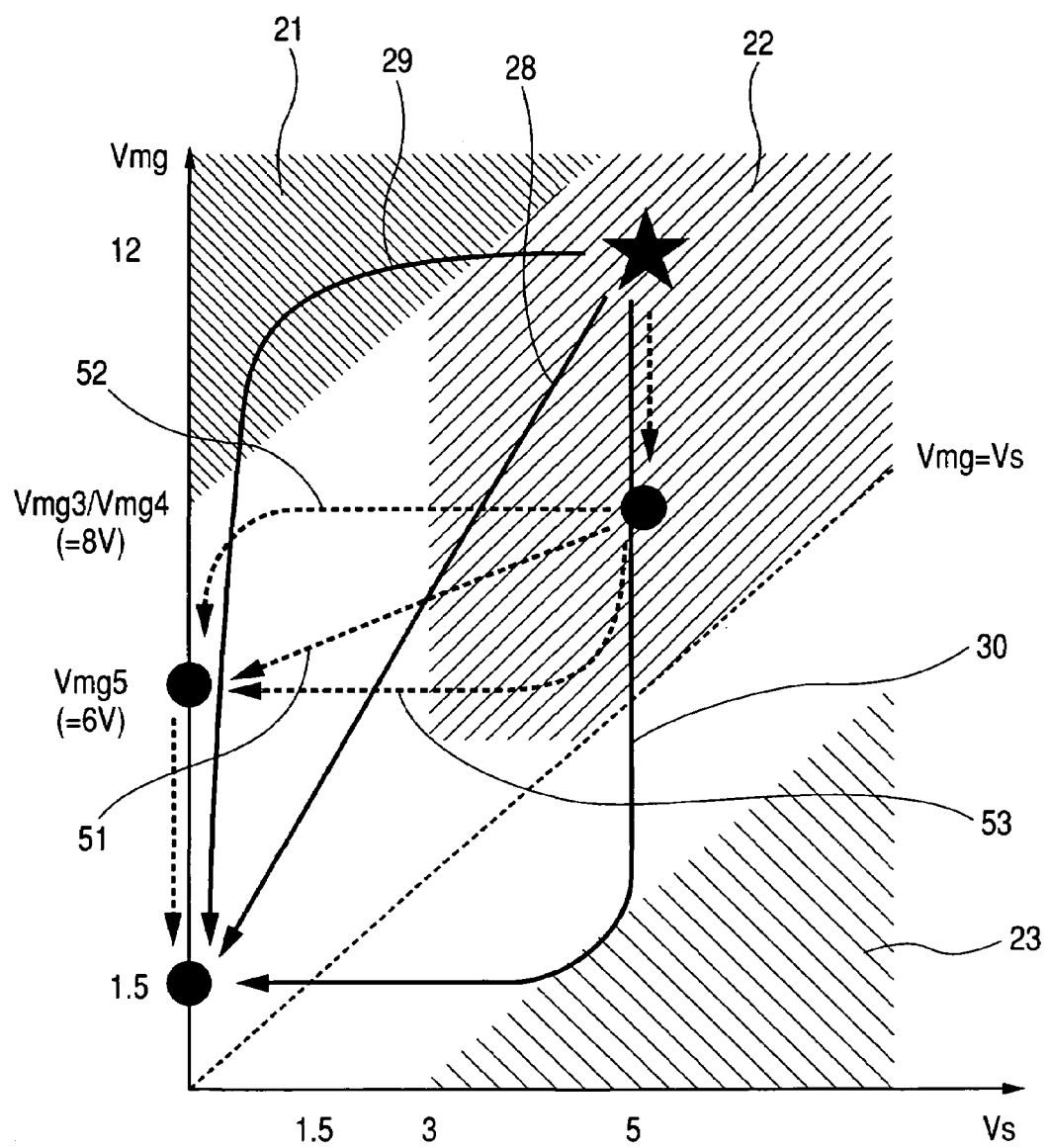
FIG. 11 illustrates bias transition paths according to the present invention arranged in order.

Since Vs drops to the ground level at the trailing edge and therefore the change rate thereof may be different from Vmg. This state will now be explained with reference to FIG. 11. Also in FIG. 11, regions 21, 22 and 23 are the same as in FIG. 10, etc. referred to above. FIG. 11 shows an arranged state of sequence in terms of a time series for each terminal, including selection gate, substrate and Vmg, Vs of unselected cells. For example, in case of direct rise of bias from a write state to a stand-by state, if the change rate of Vmg and that of Vs are different, such a rectilinear path as indicated at 28 in FIG. 1 is not obtained, but in the worst case the path follows curved paths 29 and 30 and passes the disturb region 21 or 23. If intermediate potentials Vmg4 and Vmg5 are set to avoid such an inconvenience, it is possible to surely avoid the disturb regions even in case of different bias change rates as illustrated by curved lines 24, 25 and 26 in FIG. 11. In the illustrated example, Vmg5 is set at 6V for example. Subsequent rise of Vmg voltage from Vmg5 is performed simultaneously with fall of the unselected word line voltage. A memory gate voltage Vmg_us of each unselected cell is assumed to be 3.5V.

Figure 12:
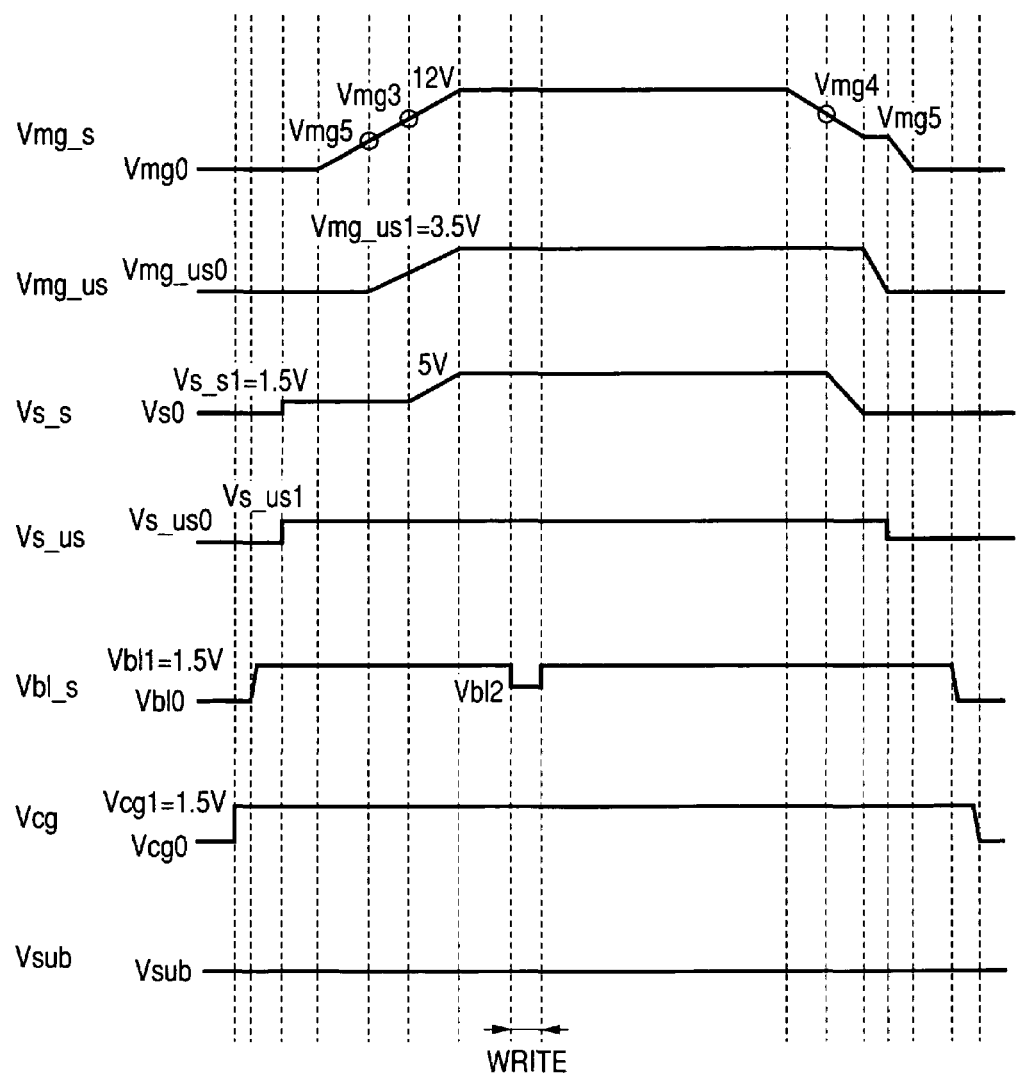
FIG. 12 is an explanatory diagram of a time series of bias changes in a third embodiment of the present invention.

It is FIG. 12 that arranges the sequence in the third embodiment in terms of a time series for each terminal, including selection gate, substrate and Vmg, Vs of unselected cells. Vmg_s, Vmg_us, Vs_us, Vb1_s, Vcg, and Vsub represent a memory gate (first gate) potential in case of selection, a memory gate potential in case of non-selection, a bit line potential (potential of the impurity diffusion region on the selection transistor side) in case of non-selection, a bit line potential in case of selection, a selection gate (second gate) potential, and a substrate potential, respectively.

Rise to the write-state voltage is performed in the order of selection gate, bit line (selection transistor-side diffusion layer), source line (memory transistor-side diffusion layer), and memory gate. By this successive rise from a lower voltage terminal, the disturb occurrence time is kept to a minimum. For the same reason, fall of voltage is performed successively from a higher voltage terminal. By this method it is possible to prevent a sequence disturb of word line bias.

According to the present invention, as described above, by setting each of the rise and fall sequences of the word line voltage in write to path able to avoid the occurrence of disturb, it is possible to suppress an undesired threshold voltage drop of already-written memory cells and an undesired threshold voltage rise of memory cells which are in a state of erase. As a result, the threshold voltage in a state of write can be taken higher, the threshold voltage in a state of erase can be taken lower, and the window width of threshold voltage can be taken wider. This provides a larger margin for threshold voltage variations with the subsequent lapse of time and improves the charge retention reliability. Besides, since the loss of an electric charge caused by disturb can be kept to a minimum, the window width of threshold voltage in program and erase cycle can be set to a minimum appropriate width required, whereby the P/E cycle stress can be diminished and the endurance is improved.

Main modes of practice of the present invention will be enumerated below.

(1) A non-volatile semiconductor memory device which is a semiconductor memory cell having a charge storage layer, a memory gate electrode and a diffusion region adjacent thereto and which is characterized in that, when applying a write voltage to the memory cell, first a potential Vs of the diffusion region is increased while keeping a potential Vmg of the memory gate electrode fixed, and after the potential Vs exceeds a certain intermediate-stage potential Vs1, the potential Vmg of the memory gate electrode is started to rise.

The value of the intermediate-stage potential Vs1 of the diffusion region is set smaller than a voltage which corresponds to the height of a potential barrier against holes of a gate insulating film material as seen from a substrate material which formed the memory cell.

(2) A non-volatile semiconductor memory device which is a semiconductor memory cell having a charge storage layer, a memory gate electrode and a diffusion region adjacent thereto and which is characterized in that, at the time of change from an applied state of a write voltage to the memory cell to another state, first a potential Vmg of the memory gate electrode is decreased while keeping a potential Vs of the diffusion layer fixed, and after the potential Vmg exceeds a certain intermediate-stage potential Vmg1, the potential Vs of the diffusion region is started to decrease.

The intermediate-stage potential Vmg1 of the memory gate electrode is set larger than a difference, Vsw−Vs1th, between a potential Vsw of the diffusion layer in a state of write and a voltage Vs1th corresponding to the height of a potential barrier against holes of a gate insulating film material as seen from a substrate material which forms the memory cell.

(3) A non-volatile semiconductor memory device which is a semiconductor memory cell having a charge storage layer, a memory gate electrode and a diffusion region adjacent thereto and which is characterized in that, when applying a write voltage to the memory cell, first a potential Vmg of the memory gate electrode is increased while keeping a potential Vs of the diffusion region fixed, and after the potential Vmg exceeds a certain intermediate-stage potential Vmg2, the potential Vs of the diffusion layer is started to rise.

The value of the intermediate-stage potential Vmg2 of the memory gate electrode is set smaller than a voltage Vmg2th at which the electric field in a gate insulating film with which the memory gate electrode is in contact becomes 6 MV/cm.

(4) A non-volatile semiconductor memory device which is a semiconductor memory cell having a charge storage layer, a memory gate electrode and a diffusion layer adjacent thereto and which is characterized in that, at the time of change from an applied state of a write voltage to the memory cell to another state, first a potential Vs of the diffusion region is decreased while keeping a potential Vmg of the memory gate electrode fixed, and after the potential Vs passes a certain intermediate-stage potential Vs2, the potential Vmg of the memory gate electrode is started to decrease.

The value of the intermediate-stage potential Vs2 of the memory gate electrode is set larger than a difference, Vmgw−Vmg2th, between a voltage Vmgw of the memory gate electrode in a state of write and a voltage Vmg2th at which the electric field in a gate insulating film with which the memory gate electrode is in contact becomes 6 MV/cm.

(5) A writing method for a non-volatile semiconductor memory device which is a semiconductor memory cell having a charge storage layer, a memory gate electrode and a diffusion region adjacent thereto and which method is characterized in that, when applying a write voltage to the memory cell, first a potential Vs of the diffusion region is increased while keeping a potential Vmg of the memory gate electrode fixed, and after the potential Vs exceeds a certain intermediate-stage potential Vs1, the potential Vmg of the memory gate electrode is started to rise.

The value of the intermediate-stage potential Vs1 of the diffusion layer is set smaller than a voltage corresponding to the height of a potential barrier against holes of a gate insulating film material as seen from a substrate material which forms the memory cell.

(6) A writing method for a non-volatile semiconductor memory device which is a semiconductor memory cell having a charge storage layer, a memory gate electrode and a diffusion region adjacent thereto and which method is characterized in that, at the time of change from an applied state of a write voltage to the memory cell to another state, first a potential Vmg of the memory gate electrode is decreased while keeping a potential Vs of the diffusion layer fixed, and after the potential Vmg passes a certain intermediate-stage potential Vmg1, the potential Vs of the diffusion layer is started to decrease.

The intermediate-stage potential Vmg1 of the memory gate electrode is set larger than a difference, Vsw−Vs1th, between a potential Vsw of the diffusion layer in a state of write and a voltage Vs1th corresponding to the height of a potential barrier against holes of a gate insulating film material as seen from a substrate material which forms the memory cell.

(7) A writing method for a non-volatile semiconductor device which is a semiconductor memory cell having a charge storage layer, a memory gate electrode and a diffusion region adjacent thereto and which method is characterized in that, when applying a write voltage to the memory cell, first a potential Vmg of the memory gate electrode is increased while keeping a potential Vs of the diffusion region fixed, and after the potential Vmg exceeds a certain intermediate-stage potential Vmg2, the potential Vs of the diffusion layer is started to rise.

The value of the intermediate-stage potential Vmg2 of the memory gate electrode is set smaller than a voltage Vmg2th at which the electric field in a gate insulating film with which the memory gate electrode is in contact becomes 6 MV/cm.

(8) A writing method for a non-volatile semiconductor device which is a semiconductor memory cell having a charge storage layer, a memory gate electrode and a diffusion region adjacent thereto and which method is characterized in that, at the time of change from an applied state of a write voltage to the memory cell to another state, first a potential Vs of the diffusion region is decreased while keeping a potential Vmg of the memory gate electrode fixed, and after the potential Vs exceeds a certain intermediate-stage potential Vs2, the potential Vmg of the memory gate electrode is started to decrease.

The value of the intermediate-stage potential Vs2 of the memory gate electrode is set larger than a difference, Vmgw−Vmg2th, between a voltage Vmgw of the memory gate electrode in a state of write and a voltage Vmg2th at which the electric field in a gate insulating film with which the memory gate electrode is in contact becomes 6 MV/cm.

The following is an explanation of main reference numerals in order to assist understanding of the drawings.

30: first impurity diffusion region (source diffusion region), 31: second impurity diffusion region (drain diffusion region), 1, 5: silicidation region formed within impurity diffusion region, 10: semiconductor substrate, 11: memory gate electrode, 12: selection gate electrode, 13: bottom oxide film, 14: silicon nitride film, 15: top oxide film, 16-1, 16-2: silicide portion, 2: memory gate line, 3: selection gate line, 4: bit line, 21: threshold voltage rise region by FN injection, 22: SSI write region, 23: threshold voltage decrease region by BTBT, 24: stand-by position, 25: write position, 26: path 1, 27: path 2, 34: contact hole, 35: conductor layer, 36: wiring layer, 37: device isolation region, 40: silicon substrate, 41: bottom oxide film, 42: charge storage layer, 43: top oxide film, 44: gate electrode, 45: Fermi level, 46: potential barrier against holes, 47: gate insulating film, 48: insulating film, 51, 52, 53: path, 60: unit memory cell portion

What is claimed is:

1. A non-volatile semiconductor memory device including at least a memory cell group of a plurality of interconnected memory cells, each of said memory cells comprising:

a first impurity diffusion region and a second impurity diffusion region both provided on a semiconductor substrate;

a channel region sandwiched in between said first and second impurity diffusion regions;

a first gate electrode provided over said channel region on a side close to said first impurity diffusion region at least through a charge storage layer; and a second gate electrode provided over said channel region on a side close to said second impurity diffusion region through a gate insulating film;

wherein a direction in which plural said first gate electrodes are connected and a direction in which plural said first impurity diffusion regions are connected are the same, each of said memory cells performs an operation of changing a potential of said first gate electrode between a first predetermined level and a second predetermined level higher than said first predetermined level, and in connection with an application of the potential to said first gate electrode and the application of a potential to said first impurity diffusion region, at least one of the potential (Vmg) applied to said first gate electrode and the potential (Vs) applied to said first impurity diffusion region is increased, and before arrival at predetermined levels required of both said potentials, the potential not having been subjected to the potential change out of the potential applied to said first gate electrode and the potential applied to said first impurity diffusion region is increased, thereby obtaining predetermined potential states in the memory cell concerned.

2. A non-volatile semiconductor memory device according to claim 1, wherein, in connection with the potential application to said first gate electrode and the potential application to said first impurity diffusion region, at least one of the potential (Vmg) applied to said first gate electrode and the potential (Vs) applied to said first impurity diffusion region is increased, and after this potential exceeds a desired level (Vs1 or Vmg2), the potential not having been increased out of the potential applied to said first gate electrode and the potential applied to said first impurity diffusion region is increased.

3. A non-volatile semiconductor device according to claim 2, wherein, in connection with the potential application to said first gate electrode and the potential application to said first impurity diffusion region, the potential (Vmg) applied to said first gate electrode is made a desired level required of it, then in this state the potential (Vs) applied to said first impurity diffusion region is increased, and after this potential exceeds a desired level (Vs1), the potential (Vmg) applied to said first gate electrode is increased.

4. A non-volatile semiconductor memory device according to claim 3, wherein the desired level (Vs1) of said first impurity diffusion region is smaller than a level corresponding to the height of a potential barrier against holes of a gate insulating film material as seen from the material of said semiconductor substrate.

5. A non-volatile semiconductor memory device according to claim 2, wherein, in connection with the potential application to said first gate electrode and the potential application to said first impurity diffusion region, the potential (Vs) applied to said first impurity diffusion region is made its desired level, then in this state the potential applied to said first gate electrode is increased, and after this potential exceeds its desired level (Vmg2), the potential (Vs) applied to said first impurity diffusion region is increased, thereby applying a write potential to the memory cell concerned.

6. A non-volatile semiconductor memory device according to claim 5, wherein the value of the desired level (Vmg2) of said first gate electrode is smaller than a level (Vmg2th) at which the electric field in a gate insulating film with which said gate electrode is in contact becomes 6 MV/cm.

7. A non-volatile semiconductor memory device according to claim 2, wherein in case of increasing at least either the potential (Vmg) applied to said first gate electrode or the potential (Vs) applied to said first impurity diffusion region, the potential that is not increased is kept constant.

8. A non-volatile semiconductor memory device according to claim 1, including a process of, in connection with the potential application to said first gate electrode, increasing at least either the potential (Vmg) applied to said first gate electrode or the potential (Vs) applied to said impurity diffusion region, and before arrival at the predetermined levels required of both said levels, increasing the potential not having been subjected to the potential change out of the potential applied to said first gate electrode and the potential applied to said first impurity diffusion region, and further including at least a process of increasing the potential not having been subjected to the new potential increase out of the potential applied to the first gate electrode (Vmg) and the potential (Vs) applied to said first impurity diffusion region before arrival of the newly increased potential at the predetermined level required of it.

9. A non-volatile semiconductor memory device according to claim 8, wherein in case of increasing at least either the potential (Vmg) applied to said first gate electrode or the potential (Vs) applied to said first impurity diffusion region, the potential that is not increased is kept constant.

10. A non-volatile semiconductor memory device according to claim 1, including a process of, in connection with the potential application to said first gate electrode, decreasing at least either the potential (Vmg) applied to said first gate electrode and the potential (Vs) applied to said first impurity diffusion region, and before arrival at the predetermined levels required of both said levels, decreasing the potential not having been subjected to the potential change out of the potential applied to said first gate electrode and the potential applied to said first impurity diffusion region, and further including at least a process of decreasing the potential not having been subjected to the new potential decrease out of the potential applied to said first gate electrode (Vmg) and the potential (Vs) applied to said first impurity diffusion region before arrival of the newly decreased potential at the predetermined level required of it.

11. A non-volatile semiconductor memory device according to claim 10, wherein in case of decreasing at least either the potential (Vs) applied to said first impurity diffusion region or the potential (Vmg) applied to said first gate electrode, the potential that is not decreased is kept constant.

12. A non-volatile semiconductor device including at least a memory cell group of a plurality of interconnected memory cells, each of said memory cells comprising:

a first impurity diffusion region and a second impurity diffusion region both provided on a semiconductor substrate;

a channel region sandwiched in between said first and second impurity diffusion regions;

a first gate electrode provided over said channel region on a side close to said first impurity diffusion region at least through a charge storage layer; and a second gate electrode provided over said channel region on a side close to said second impurity diffusion region through a gate insulating film, wherein a direction in which plural said first gate electrodes are connected and a direction in which plural said first impurity diffusion regions are connected are the same, each of said memory cells performs an operation of changing a potential of said first gate electrode between a first predetermined level and a second predetermined level higher than said first predetermined level, and in connection with an application of the potential to said first gate electrode and the application of a potential to said first impurity diffusion region, at least one of the potential (Vmg) applied to said first gate electrode and the potential (Vs) applied to said first impurity diffusion region is decreased, and before arrival at predetermined levels required of both said potentials, the potential not having been subjected to the potential change out of the potential applied to the first gate electrode and the potential applied to the first impurity diffusion region is decreased, thereby obtaining predetermined potential states in the memory cell concerned.

13. A non-volatile semiconductor device according to claim 12, wherein, in connection with the potential application to said first gate electrode and the potential application to said first impurity diffusion region, at least one of the potential (Vs) applied to said first impurity diffusion region and the potential (Vmg) applied to said first gate electrode is decreased, and after this potential goes below a desired level (Vmg1 or Vs2), the potential not having been decreased out of the potential applied to the first gate electrode and the potential applied to the first impurity diffusion region is decreased, thereby changing a write potential in the memory cell concerned into another potential state.

14. A non-volatile semiconductor memory device according to claim 13, wherein in case of decreasing at least either the potential (Vs) applied to said first impurity diffusion region or the potential (Vmg) applied to said first gate electrode, the potential that is not decreased is kept constant.

15. A non-volatile semiconductor memory device according to claim 12, wherein, in connection with the potential application to said first gate electrode and the potential application to said first impurity diffusion region, the potential (Vs) applied to said first impurity diffusion region is decreased, and after this potential goes below a desired level (Vg2), the potential applied to said first gate electrode is decreased, thereby changing a write potential in the memory cell concerned into another potential state.

16. A non-volatile semiconductor memory device according to claim 15, wherein the value of the desired level (Vs2) of said first impurity diffusion region is larger than a difference (Vmgw-Vmg2th) between a level (Vmgm) of a memory gate electrode in a state of write and a level (Vmg2th) at which the electric field in a gate insulating film with which said first gate electrode is in contact becomes 6 MV/cm.

17. A non-volatile semiconductor memory device according to claim 12, wherein, in connection with the potential application to said first gate electrode and the potential application to said first impurity diffusion region, the potential (Vmg) applied to said first gate electrode is decreased, and after this potential goes below a desired level (Vmg1), the potential applied to said first impurity diffusion region is decreased, thereby changing a write potential in the memory cell concerned into another potential state.

18. A non-volatile semiconductor memory device according to claim 17, wherein the value of said desired level (Vmg1) is larger than a difference (Vsw-Vs1th) between a level (Vsw) of said impurity diffusion region in a state of write and a level (Vs1th) corresponding to the height of a potential barrier against holes of the material of a first gate insulating film as seen from said semiconductor substrate.

* * * * *